(12) United States Patent
Liu

(10) Patent No.: US 10,651,187 B2
(45) Date of Patent: May 12, 2020

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/149,093

(22) Filed: Oct. 1, 2018

(65) Prior Publication Data

US 2020/0091164 A1 Mar. 19, 2020

Related U.S. Application Data

(63) Continuation of application No. PCT/CN2018/105727, filed on Sep. 14, 2018.

(51) Int. Cl.
*H01L 27/11556* (2017.01)
*H01L 27/11524* (2017.01)
(Continued)

(52) U.S. Cl.
CPC .... *H01L 27/11556* (2013.01); *H01L 27/1157* (2013.01); *H01L 27/11524* (2013.01);
(Continued)

(58) Field of Classification Search
CPC ......... H01L 27/11556; H01L 27/11524; H01L 27/11529; H01L 27/11531;
(Continued)

(56) References Cited

U.S. PATENT DOCUMENTS

2009/0267128 A1* 10/2009 Maejima ........... H01L 27/11565
257/314
2012/0062777 A1* 3/2012 Kobayashi ........ H01L 27/14612
348/302
(Continued)

FOREIGN PATENT DOCUMENTS

CN 107658317 A 2/2018
TW 201019416 A 5/2010

OTHER PUBLICATIONS

English Machine Translation of Chinese Patent No. 101038906. (Year: 2006).*

*Primary Examiner* — Dzung Tran
(74) *Attorney, Agent, or Firm* — Bayes PLLC

(57) ABSTRACT

Embodiments of three-dimensional (3D) memory devices and methods for forming the 3D memory devices are disclosed. In an example, a 3D memory device includes a substrate, a peripheral device disposed on the substrate, a peripheral interconnect layer disposed above the peripheral device, a first source plate disposed above and electrically connected to the peripheral interconnect layer, a first memory stack disposed on the first source plate, a first memory string extending vertically through the first memory stack and in contact with the first source plate, and a first bit line disposed above and electrically connected to the first memory string and the peripheral device.

12 Claims, 8 Drawing Sheets

(51) Int. Cl.
  *H01L 27/11529* (2017.01)
  *H01L 27/11531* (2017.01)
  *H01L 27/11548* (2017.01)
  *H01L 27/1157* (2017.01)
  *H01L 27/11573* (2017.01)
  *H01L 27/11575* (2017.01)
  *H01L 27/11582* (2017.01)

(52) U.S. Cl.
  CPC .. *H01L 27/11529* (2013.01); *H01L 27/11531* (2013.01); *H01L 27/11548* (2013.01); *H01L 27/11573* (2013.01); *H01L 27/11575* (2013.01); *H01L 27/11582* (2013.01)

(58) Field of Classification Search
  CPC ........... H01L 27/11548; H01L 27/1157; H01L 27/11573; H01L 27/11575; H01L 27/11582
  USPC ....................................................... 257/315
  See application file for complete search history.

(56) References Cited

U.S. PATENT DOCUMENTS

| | | | | |
|---|---|---|---|---|
| 2012/0181602 | A1* | 7/2012 | Fukuzumi | H01L 27/0688 257/326 |
| 2016/0358927 | A1* | 12/2016 | Nam | H01L 27/1157 |
| 2017/0243650 | A1* | 8/2017 | Ogawa | G11C 16/0483 |
| 2017/0330887 | A1* | 11/2017 | Kim | H01L 27/11565 |

* cited by examiner

THREE-DIMENSIONAL MEMORY DEVICES AND METHODS FOR FORMING THE SAME

CROSS REFERENCE TO RELATED APPLICATION

This application is continuation of International Application No. PCT/CN2018/105727, filed on Sep. 14, 2018, entitled "THREE-DIMENSIONAL MEMORY DEVICES AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a substrate, a peripheral device disposed on the substrate, a peripheral interconnect layer disposed above the peripheral device, a first source plate disposed above and electrically connected to the peripheral interconnect layer, a first memory stack disposed on the first source plate, a first memory string extending vertically through the first memory stack and in contact with the first source plate, and a first bit line disposed above and electrically connected to the first memory string and the peripheral device.

In another example, a 3D memory device includes a substrate, a peripheral device including a multiplexer disposed on the substrate, a first memory stack disposed above the peripheral device, a first memory string extending vertically through the first memory stack, a first bit line disposed above and electrically connected to the first memory string and the multiplexer, a second memory stack disposed above the first bit line, a second memory string extending vertically through the second memory stack, a second bit line disposed above and electrically connected to the second memory string and the multiplexer. The multiplexer is configured to select one of the first and second memory strings.

In a further example, a method for forming a 3D memory device is disclosed. A peripheral device is formed on a substrate. A peripheral interconnect layer is formed above the peripheral device. A first source plate is formed above and electrically connected to the peripheral interconnect layer. A first memory string extending vertically through a first memory stack is formed. The first memory string is above and in contact with the first source plate. A first bit line is formed above and electrically connected to the first memory string and the peripheral device.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
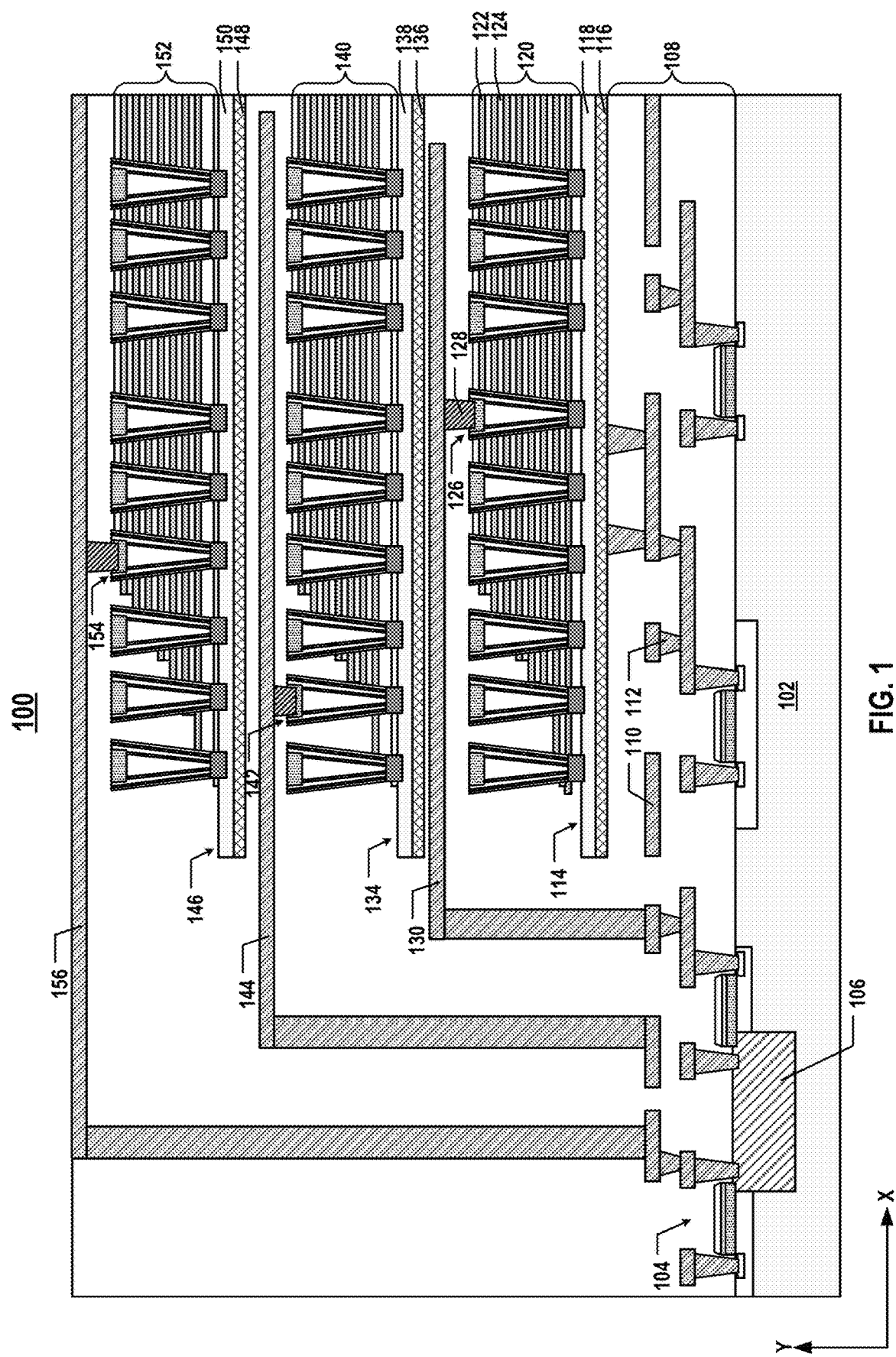
FIG. 1 illustrates a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide 3D memory devices and methods for forming the 3D memory devices with smaller die size, higher cell density, and improved performance compared with some other 3D memory devices. By vertically stacking memory array devices above peripheral devices, the cell density and array efficiency of the resulting 3D memory device can be increased, and the die size and bit cost can be reduced. In some embodiments, 3D memory devices disclosed herein can implement a "multi-memory stack" architecture, which enables continuing scaling of 3D memory devices to further increase cell density and lower bit cost. In some embodiments, a source plate including a conductive plate and a semiconductor plate can be used as the common source of "floating gate" type of NAND memory strings in the same memory stack, thereby reducing the source line resistance.

FIG. 1 illustrates a cross-section of an exemplary 3D memory device 100, according to some embodiments of the present disclosure. 3D memory device 100 represents an example of a monolithic 3D memory device. The term "monolithic" means components of the 3D memory device are formed on a single substrate. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials.

3D memory device 100 can include a peripheral device 104 on substrate 102. Peripheral device 104 can be formed "on" substrate 102, in which the entirety or part of peripheral device 104 is formed in substrate 102 (e.g., below the top surface of substrate 102) and/or directly on substrate 102. Peripheral device 104 can include a plurality of transistors formed on substrate 102. Isolation regions (e.g., shallow trench isolations (STIs)) and doped regions (e.g., source regions and drain regions of the transistors) can be formed in substrate 102 as well.

Peripheral device 104 can include any suitable digital, analog, and/or mixed-signal peripheral circuits used for facilitating the operation of 3D memory device 100. For example, peripheral device 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some embodiments, peripheral device 104 is formed on substrate 102 using complementary metal-oxide-semiconductor (CMOS) technology.

In some embodiments, peripheral device 104 includes a multiplexer 106. A multiplexer (also known as "MUX") is a device that selects one of several analog or digital input signals and forwards the selected input into a single line. In some embodiments, multiplexer 106 is configured to select one of multiple memory strings (or memory stacks) and forward the input from the selected memory string (or memory stack) into a data buffer and/or a driver, such as a bit line page buffer and/or a word line driver. That is, the data buffer and driver of peripheral device 104 can be shared by multiple memory strings (or memory stacks) through multiplexer 106. The details of sharing peripheral device 104 using multiplexer 106 will be described below.

3D memory device 100 can include an interconnect layer (referred to herein as a "peripheral interconnect layer" 108) above peripheral device 104 to transfer electrical signals to and from peripheral device 104. Peripheral interconnect layer 108 can include a plurality of interconnects (also referred to herein as "contacts"), including lateral interconnect lines 110 and vertical interconnect access (via) contacts 112. As used herein, the term "interconnects" can broadly include any suitable types of interconnects, such as middle-end-of-line (MEOL) interconnects and back-end-of-line (BEOL) interconnects. Peripheral interconnect layer 108 can further include one or more interlayer dielectric (ILD) layers (also known as "intermetal dielectric (IMD) layers") in which interconnect lines 110 and via contacts 112 can form. That is, peripheral interconnect layer 108 can include interconnect lines 110 and via contacts 112 in multiple ILD layers. Interconnect lines 110 and via contacts 112 in peripheral interconnect layer 108 can include conductive materials including, but not limited to, tungsten (W), cobalt (Co), copper (Cu), aluminum (Al), silicides, or any combination thereof. The ILD layers in peripheral interconnect layer 108 can include dielectric materials including, but not limited to, silicon oxide, silicon nitride, silicon oxynitride, low dielectric constant (low-k) dielectrics, or any combination thereof.

3D memory device 100 can include one or more memory array devices above peripheral device 104 and peripheral interconnect layer 108. It is noted that x and y axes are added in FIG. 1 to further illustrate the spatial relationship of the components in 3D memory device 100. Substrate 102 includes two lateral surfaces (e.g., a top surface and a bottom surface) extending laterally in the x-direction (the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (the vertical direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND memory strings. Each array of NAND memory strings can be formed in a memory stack. As shown in FIG. 1, 3D memory device 100 can include multiple memory array devices stacked vertically above peripheral device 104 and peripheral interconnect layer 108. Each memory array device can include a source plate, a memory stack on the source plate, and an array of NAND memory strings each extending vertically through the memory stack and in contact with the source plate. It is understood that in some embodiments, 3D memory device 100 includes a single memory array device above peripheral device 104 and peripheral interconnect layer 108.

As shown in FIG. 1, 3D memory device 100 can include a first memory array device above peripheral device 104 and peripheral interconnect layer 108. The first memory array device can include a first source plate 114, a first memory stack 120, and an array of first NAND memory strings 126. First source plate 114 can be disposed above and electrically connected to peripheral interconnect layer 108. In some embodiments, first source plate 114 includes a conductive plate 116 in contact with peripheral interconnect layer 108, e.g., the interconnects in the upper ILD layer of peripheral interconnect layer 108. First source plate 114 can further include a semiconductor plate 118 disposed on conductive plate 116 and in contact with the lower end of first NAND memory strings 126. First source plate 114 can function as the common source of array of first NAND memory strings 126. In some embodiments, semiconductor plate 118 includes a semiconductor material including, but not limited to silicon, such as amorphous silicon, polysilicon, or single crystalline silicon. Conductive plate 116 can reduce the electrical resistance between semiconductor plate 118 and peripheral interconnect layer 108. In some embodiments, conductive plate 116 includes conductive materials, including metals (e.g., W, Co, Cu, and Al), metal alloys, and metal silicide (e.g., tungsten silicide, cobalt silicide, copper silicide, and aluminum silicide). In one example, semiconductor plate 118 includes polysilicon, and conductive plate 116 includes tungsten silicide (WSix).

In some embodiments, the first memory array device includes first NAND memory string 126 that extends vertically through a plurality of pairs each including a semiconductor layer 122 and a dielectric layer 124 (referred to herein as "semiconductor/dielectric layer pairs"). The stacked semiconductor/dielectric layer pairs are also referred to herein as first memory stack 120. Interleaved semiconductor layers 122 and dielectric layers 124 in first memory stack 120 alternate in the vertical direction, according to some embodiments. In other words, except the ones at the top or bottom of first memory stack 120, each semiconductor layer 122 can be adjoined by two dielectric layers 124 on both sides, and each dielectric layer 124 can be adjoined by two semiconductor layers 122 on both sides. Semiconductor layers 122 can each have the same thickness or a different thickness. Similarly, dielectric layers 124 can each have the same thickness or a different thickness. Semiconductor layers 122 can include semiconductor materials, such as polysilicon. Dielectric layers 124 can include dielectric materials, such as silicon oxide.

Figure 2:
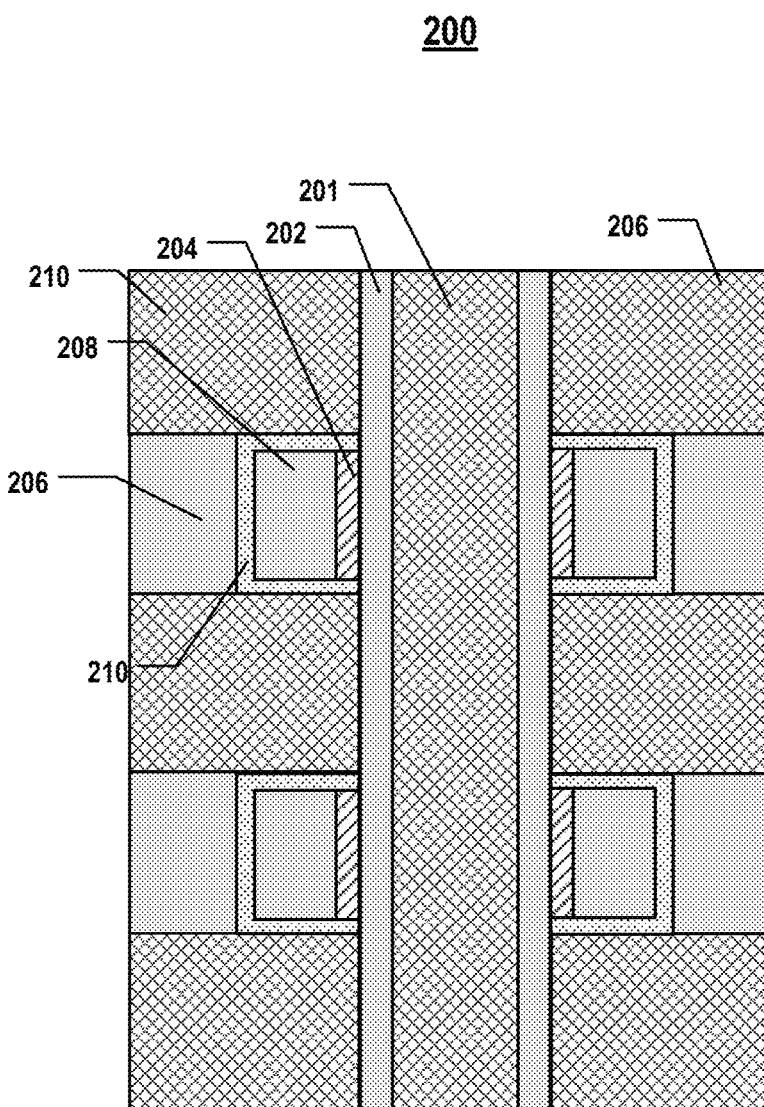
FIG. 2 illustrates a cross-section of an exemplary NAND memory string having floating gates, according to some embodiments of the present disclosure.

FIG. 2 illustrates a cross-section of an exemplary NAND memory string 200 having floating gates 208, according to some embodiments of the present disclosure. NAND memory string 200 is one example of first NAND memory string 126 illustrated in FIG. 1. NAND memory string 200 can include a dielectric filling layer 201, a semiconductor channel 202, a tunneling layer 204, floating gates 208, and a blocking layer 210. In some embodiments, dielectric filling layer 201 includes silicon oxide, and semiconductor channel 202 includes silicon, such as amorphous silicon, polysilicon, or single crystalline silicon. In some embodiments, tunneling layer 204 includes silicon oxide, silicon oxynitride, or a combination thereof. Floating gates 208 can include semiconductor materials, such as polysilicon. Blocking layer 210 can include silicon oxide, silicon oxynitride, high dielectric constant (high-k) dielectrics, or any combination thereof. NAND memory string 200 can have a cylinder shape (e.g., a pillar shape). Dielectric filling layer 201, semiconductor channel 202, tunneling layer 204, floating gates 208, and blocking layer 210 are arranged along the radial direction from the center toward the outer surface of the pillar in this order, according to some embodiments.

NAND memory string 200 can also include multiple control gates 206 and gate dielectrics 210. Control gates 206 can be parts of semiconductor layers 122 illustrated in FIG. 1 that abut first NAND memory string 126. Control gates 206 thus can include semiconductor materials, such as polysilicon. In some embodiments, control gates 206 can include conductive materials including, but not limited to, W, Co, Cu, Al, silicides, or any combination thereof. Gate dielectrics 210 can be parts of dielectric layers 124 illustrated in FIG. 1 that abut first NAND memory string 126. Gate dielectrics 210 thus can include dielectric materials, such as silicon oxide, silicon oxynitride, high-k dielectrics, or any combination thereof.

Referring back to FIG. 1, it is understood that first NAND memory strings 126 are not limited to the "floating gate" type of NAND memory strings (e.g., NAND memory strings 200), and first memory stack 120 is not limited to the "semiconductor/dielectric layer pairs" type of memory stack. In some embodiments, first memory stack 120 includes a plurality of pairs each including a conductor layer 122 and dielectric layer 124 (referred to herein as "conductor/dielectric layer pairs"). Interleaved conductor layers 122 and dielectric layers 124 in first memory stack 120 alternate in the vertical direction, according to some embodiments. In other words, except the ones at the top or bottom of first memory stack 120, each conductor layer 122 can be adjoined by two dielectric layers 124 on both sides, and each dielectric layer 124 can be adjoined by two conductor layers 122 on both sides. Conductor layers 122 can each have the same thickness or a different thickness. Similarly, dielectric layers 124 can each have the same thickness or a different thickness. Conductor layers 122 can include conductive materials including, but not limited to, W, Co, Cu, Al, silicides, or any combination thereof. Dielectric layers 124 can include dielectric materials including, but not limited to, silicon oxide, silicon nitride, silicon oxynitride, or any combination thereof.

In some embodiments, each first NAND memory string 126 is a "charge trap" type of NAND memory string, which includes a semiconductor channel and a composite dielectric layer (also known as a "memory film"). In some embodiments, the semiconductor channel includes silicon, such as amorphous silicon, polysilicon, or single crystalline silicon. In some embodiments, the composite dielectric layer includes a tunneling layer, a storage layer (also known as "charge trap layer"), and a blocking layer. Each first NAND memory string 126 can have a cylinder shape (e.g., a pillar shape). The semiconductor channel, the tunneling layer, the storage layer, and the blocking layer are arranged along the radial direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$), or hafnium oxide ($HfO_2$) or tantalum oxide ($Ta_2O_5$) layer, and so on.

In some embodiments, first NAND memory strings 126 further include a plurality of control gates (each being part of a word line). Each conductor layer or semiconductor layer 122 in first memory stack 120 can act as a control gate for each memory cell of first NAND memory string 126. Each first NAND memory string 126 can include a source select gate at its lower end and a drain select gate at its upper end. As used herein, the "upper end" of a component (e.g., first NAND memory string 126) is the end farther away from substrate 102 in the y-direction, and the "lower end" of the component (e.g., first NAND memory string 126) is the end closer to substrate 102 in the y-direction. As shown in FIG. 1, array of first NAND memory strings 126 can share a common source, i.e., first source plate 114, by contacting the respective lower end with semiconductor plate 118.

3D memory device 100 can further include a first bit line 130 disposed above and electrically connected to first NAND memory string 126 and peripheral device 104. In some embodiments, the drain at the upper end of first NAND memory string 126 is electrically connected to first bit line 130 through a first bit line contact 128. First bit line contact 128 and first bit line 130 can include conductive materials, such as W, Co, Cu, and Al, formed in one or more ILD layers above first memory stack 120. First bit line 130 can be electrically connected to peripheral device 104, such as multiplexer 106, through the interconnects in peripheral interconnect layer 108. As a result, first NAND memory string 126 can be one of the inputs of multiplexer 106 through first bit line 130.

As described above, in some embodiments, 3D memory device 100 includes multiple memory array devices stacked vertically, such as a second memory array device stacked above the first memory array device. The second memory array device can include a second source plate 134 disposed above first bit line 130 and electrically connected to peripheral interconnect layer 108, a second memory stack 140 disposed on second source plate 134, and an array of second NAND memory strings 142 each extending vertically through second memory stack 140 and in contact with second source plate 134.

Similar to the counterparts in the first memory array device, second source plate 134 can include a conductive plate 136 electrically connected to (not shown) peripheral interconnect layer 108, and a semiconductor plate 138 disposed on conductive plate 136 and in contact with the lower end of second NAND memory string 142. Second source plate 134 can function as the common source of array of second NAND memory strings 142. In some embodiments, semiconductor plate 138 includes a semiconductor material including, but not limited to silicon, such as amorphous silicon, polysilicon, or single crystalline silicon. In some embodiments, conductive plate 136 includes conductive materials, including metals (e.g., W, Co, Cu, and Al) and metal silicide (e.g., tungsten silicide, cobalt silicide, copper silicide, and aluminum silicide). In one example, semiconductor plate 138 includes polysilicon, and conductive plate 136 includes tungsten silicide (WSix).

Similar to the counterparts in the first memory array device, second memory stack 140 can include a plurality of semiconductor/dielectric layer pairs or a plurality of conductor/dielectric layer pairs, and second NAND memory string 142 can be a "floating gate" type of NAND memory string or a "charge trap" type of NAND memory string as described above in detail. Nevertheless, 3D memory device 100 can also include a second bit line 144 disposed above and electrically connected to second NAND memory string 142 and peripheral device 104. In some embodiments, the drain at the upper end of second NAND memory string 142 is electrically connected to second bit line 144. Second bit line 144 can be electrically connected to peripheral device 104, such as multiplexer 106, through the interconnects in peripheral interconnect layer 108. As a result, second NAND memory string 142 can be another input of multiplexer 106 through second bit line 144. Multiplexer 106 thus can be configured to select one of first NAND memory string(s) 126 in the first memory array device and second NAND memory string(s) 142 in the second memory array device. First NAND memory string(s) 126 in the first memory array device and second NAND memory string(s) 142 in the second memory array device can share the same data buffer (e.g., the bit line page buffer) and/or driver (e.g., the word line driver) in peripheral device 104 by multiplexer 106.

As shown in FIG. 1, in some embodiments, 3D memory device 100 further includes a third memory array device including a third source plate 146 disposed above second bit line 144 and electrically connected to peripheral interconnect layer 108, a third memory stack 152 disposed on third source plate 146, and an array of third NAND memory strings 154 each extending vertically through third memory stack 152 and in contact with third source plate 146. Third source plate 146 can include a conductive plate 148 electrically connected to (not shown) peripheral interconnect layer 108, and a semiconductor plate 150 disposed on conductive plate 148 and in contact with the lower end of third NAND memory string 154. Third source plate 146, third memory stack 152, and third NAND memory strings 154 are similar to their counterparts in the first and second memory array devices and thus, will not be repeated.

3D memory device 100 can further include a third bit line 156 disposed above and electrically connected to third NAND memory string 154 and peripheral device 104. Third bit line 156 can be electrically connected to peripheral device 104, such as multiplexer 106, through the interconnects in peripheral interconnect layer 108. As a result, third NAND memory string 154 can be still another input of multiplexer 106 through third bit line 156. Multiplexer 106 thus can be configured to select one of first NAND memory string(s) 126 in the first memory array device, second NAND memory string(s) 142 in the second memory array device, and third NAND memory string(s) 154 in the third memory array device. First NAND memory string(s) 126 in the first memory array device, second NAND memory string(s) 142 in the second memory array device, and third NAND memory string(s) 154 in the third memory array device can share the same data buffer (e.g., the bit line page buffer) and/or driver (e.g., the word line driver) in peripheral device 104 by multiplexer 106.

It is understood that the number of memory array devices is not limited by the example shown in FIG. 1 and can be n, where n is any positive integer. Although not shown, it is also understood that each of the n memory array devices can include any suitable additional components, such as gate line slits (GLSs) and other local contacts, such as word line contacts, the detail of which can be readily appreciated and thus, is not described herein.

Figure 3A:
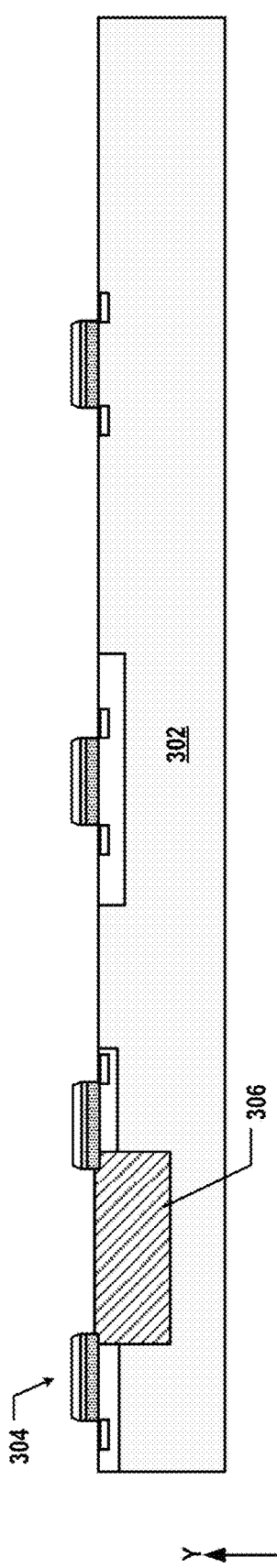
FIGS. 3A-3F illustrate an exemplary fabrication process for forming a 3D memory device, according to some embodiments of the present disclosure.
Figure 3B:
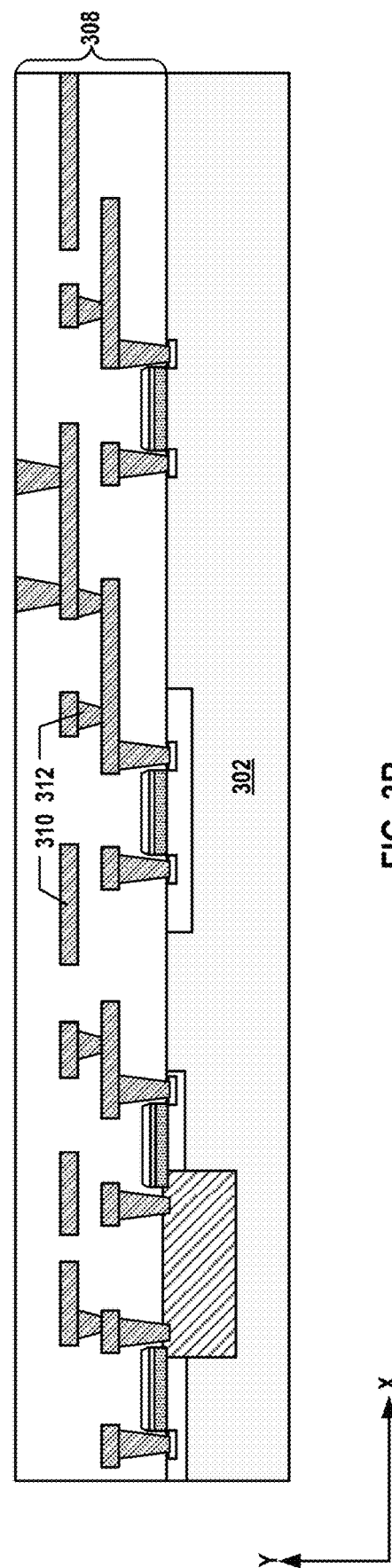

FIGS. 3A-3F illustrate an exemplary fabrication process for forming a 3D memory device, according to some embodiments of the present disclosure. FIG. 4 is a flowchart of an exemplary method for forming a 3D memory device, according to some embodiments of the present disclosure. Examples of the 3D memory device depicted in FIGS. 3A-3F and 4 include 3D memory device 100 depicted in FIG. 1. FIGS. 3A-3F and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a peripheral device is formed on a substrate. The substrate can be a silicon substrate. Operation 402 can include forming a multiplexer configured to select one of multiple memory strings, and forming a data buffer and a driver shared by the multiple memory strings through the multiplexer. As illustrated in FIG. 3A, a peripheral device 304 is formed on a silicon substrate 302. Peripheral device 304 can include a plurality of transistors formed on silicon substrate 302. The transistors can be formed by a plurality of processes including, but not limited to, photolithography, dry and/or wet etching, thin film deposition, thermal growth, implantation, chemical mechanical polishing (CMP), and any other suitable processes. In some embodiments, doped regions are formed in silicon substrate 302 by ion implantation and/or thermal diffusion, which function, for example, as source regions and/or drain regions of the transistors. In some embodiments, isolation regions (e.g., STIs) are also formed in silicon substrate 302 by dry and/or wet etching and thin film deposition. The transistors of peripheral device 304 can form a variety types of circuits, such as a multiplexer 306, a data buffer (not shown), and a driver (not shown).

Method 400 proceeds to operation 404, as illustrated in FIG. 4, in which a peripheral interconnect layer is formed above the peripheral device. The peripheral interconnect layer can include a plurality of interconnects in one or more ILD layers. As illustrated in FIG. 3B, a peripheral interconnect layer 308 can be formed on silicon substrate 302 and above peripheral device 304. Peripheral interconnect layer 308 can include interconnects, including interconnect lines 310 and via contacts 312 of MEOL and/or BEOL in a plurality of ILD layers, to make electrical connections with peripheral device 304.

In some embodiments, peripheral interconnect layer 308 includes multiple ILD layers and interconnects therein formed in multiple processes. For example, interconnect lines 310 and via contacts 312 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form interconnect lines 310 and via contacts 312 can also include photolithography, CMP, dry and/or wet etching, or any other suitable processes. The ILD layers can include dielectric materials deposited by one or more thin film deposition processes including, but not limited to, CVD, PVD, ALD, or any combination thereof. The ILD layers and interconnects illustrated in FIG. 3B can be collectively referred to as an "interconnect layer" (e.g., peripheral interconnect layer 308).

Method 400 proceeds to operation 406, as illustrated in FIG. 4, in which a first source plate is formed above and electrically connected to the peripheral interconnect layer. Operation 406 can include forming a conductive plate in contact with the peripheral interconnect layer, and forming a semiconductor plate on the conductive plate. In some embodiments, the conductive plate includes metal silicide, and the semiconductor plate includes polysilicon.

Figure 3C:
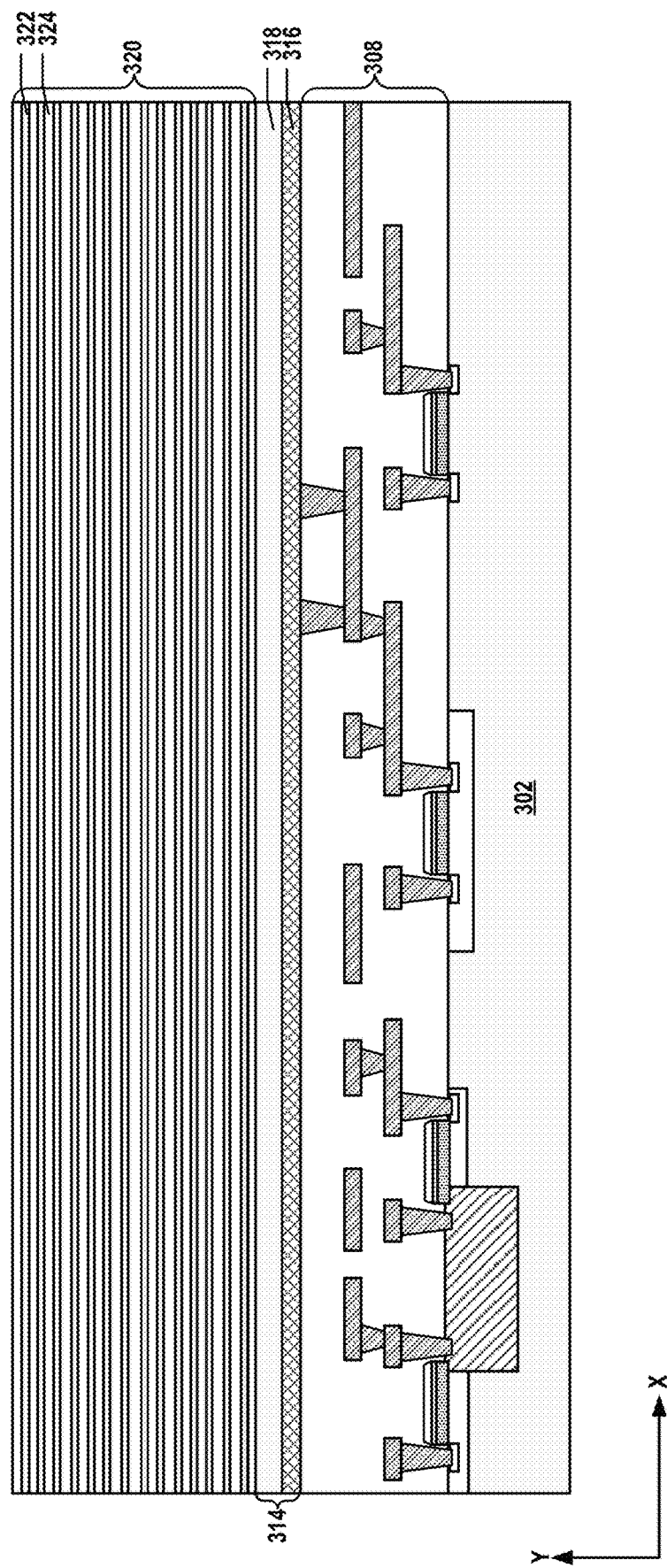
Figure 4:
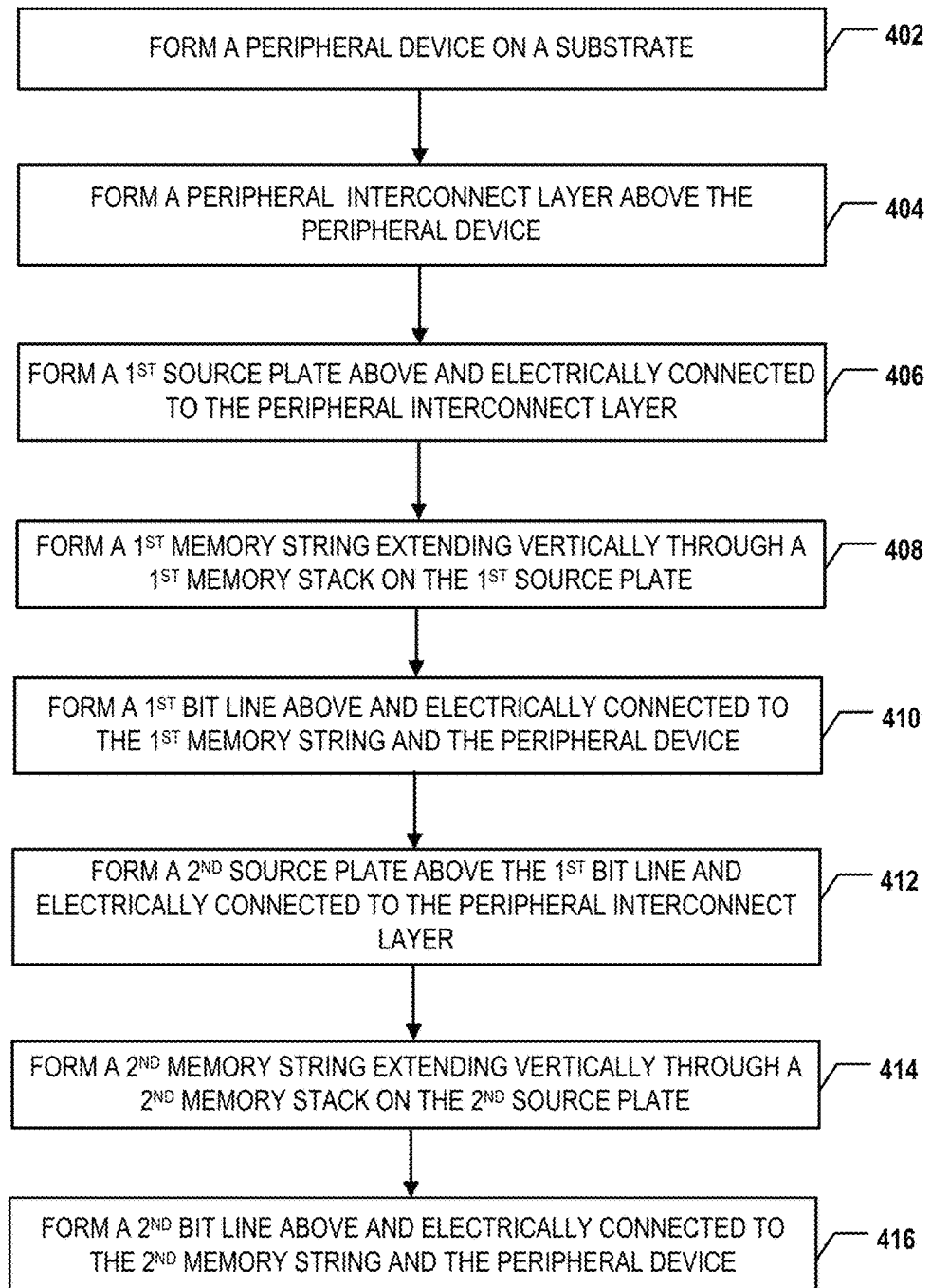
FIG. 4 is a flowchart of an exemplary method for forming a 3D memory device, according to some embodiments of the present disclosure.

As illustrated in FIG. 3C, a first source plate 314 including a conductive plate 316 and a semiconductor plate 318 is formed on the top surface of peripheral interconnect layer 308. The conductive materials in conductive plate 316 can include, but not limited to, metals, metal alloys, and metal silicides. In some embodiments, conductive plate 316 includes one or more metals, such as Cu, Co, Al, nickel (Ni), titanium (Ti), W, or any other suitable metals. In some embodiments, conductive plate 316 includes one or more metal alloys, each of which is an alloy of at least two of Cu, Co, Ni, Ti, W (e.g., TiNi alloy or a combination of TiNi alloy and TiW alloy), or any other suitable metal alloys. In some embodiments, conductive plate 316 includes one or more metal silicides, such as copper silicide, cobalt silicide, nickel silicide, titanium silicide, tungsten silicide, or any other suitable metal silicides.

Conductive plate 316 can be formed by one or more thin film deposition processes including, but not limited to, CVD, PVD, ALD, electroplating, electroless plating, or any combination thereof. Depending on the conductive materials in conductive plate 316, the deposition of conductive plate 316 may involve multiple processes. In some embodiments, the deposition of a metal silicide conductive film involves deposition of a silicon film, deposition of a metal film, and silicidation of the silicon and metal films by a thermal treatment (e.g., annealing, sintering, or any other suitable processes).

As illustrated in FIG. 3C, semiconductor plate 318 can be formed on conductive plate 316. Semiconductor plate 318 can include semiconductor materials including, but not limited to, silicon, such as amorphous silicon or polysilicon. Semiconductor plate 318 can be formed by one or more thin film deposition processes including, but not limited to, CVD, PVD, ALD, electroplating, electroless plating, or any combination thereof. In one example, first source plate 314 is formed by first depositing a tungsten film, then depositing a polysilicon film on the tungsten film, followed by silicidation of the polysilicon and tungsten films by a thermal treatment (e.g., annealing, sintering, or any other suitable processes). As a result, conductive plate 316 can be made from tungsten silicide, and semiconductor plate 318 can be made from polysilicon.

Method 400 proceeds to operation 408, as illustrated in FIG. 4, in which a first memory string extending vertically through a first memory stack is formed. The first memory string can be above and in contact with the first source plate. In some embodiments, the first memory stack is formed by depositing interleaved polysilicon layers and silicon oxide layers.

As illustrated in FIG. 3C, interleaved polysilicon layers 322 and silicon oxide layers 324 are formed on semiconductor plate 318 of first source plate 314. Interleaved polysilicon layers 322 and silicon oxide layers 324 can form a memory stack 320. In some embodiments, polysilicon layers 322 can each have the same thickness or a different thickness. Similarly, silicon oxide layers 324 can each have the same thickness or a different thickness. Memory stack 320 can be formed by one or more thin film deposition processes including, but not limited to, CVD, PVD, ALD, or any combination thereof.

Figure 3D:
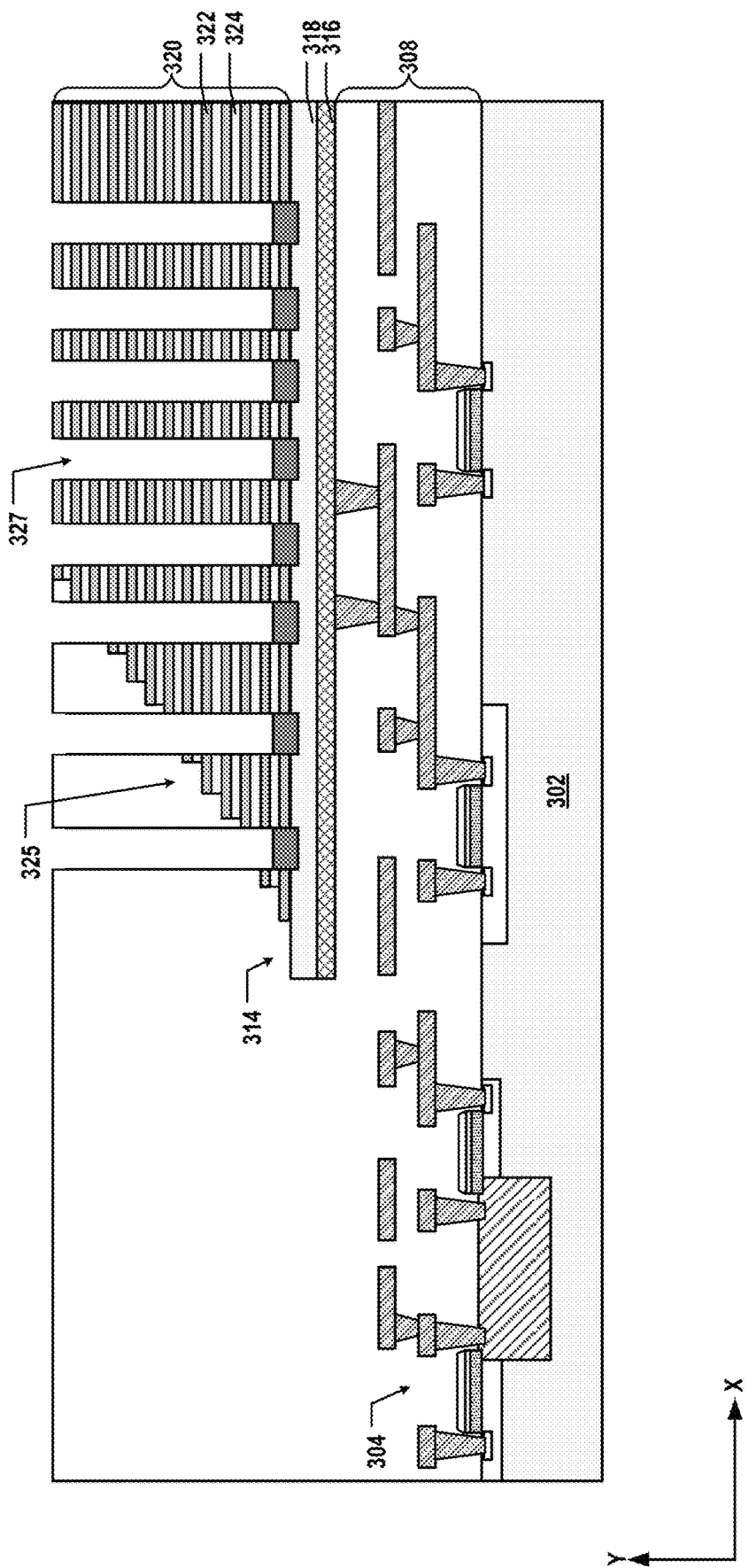

As illustrated in FIG. 3D, first source plate 314 is patterned by photolithography and etching processes to remove part that is above peripheral device 304 for interconnections between peripheral device 304 and memory array device(s). Memory stack 320 can also be patterned by the "trim-etch" processes to form one or more staircase structures 325 on the side(s) in the lateral direction for word line fan-out. As illustrated in FIG. 3D, openings (channel holes) 327 are etched through interleaved polysilicon layers 322 and silicon oxide layers 324 in memory stack 320 by wet etching and/or dry etching. In some embodiments, channel holes 327 are etched using deep reactive-ion etching (DRIE).

Figure 3E:
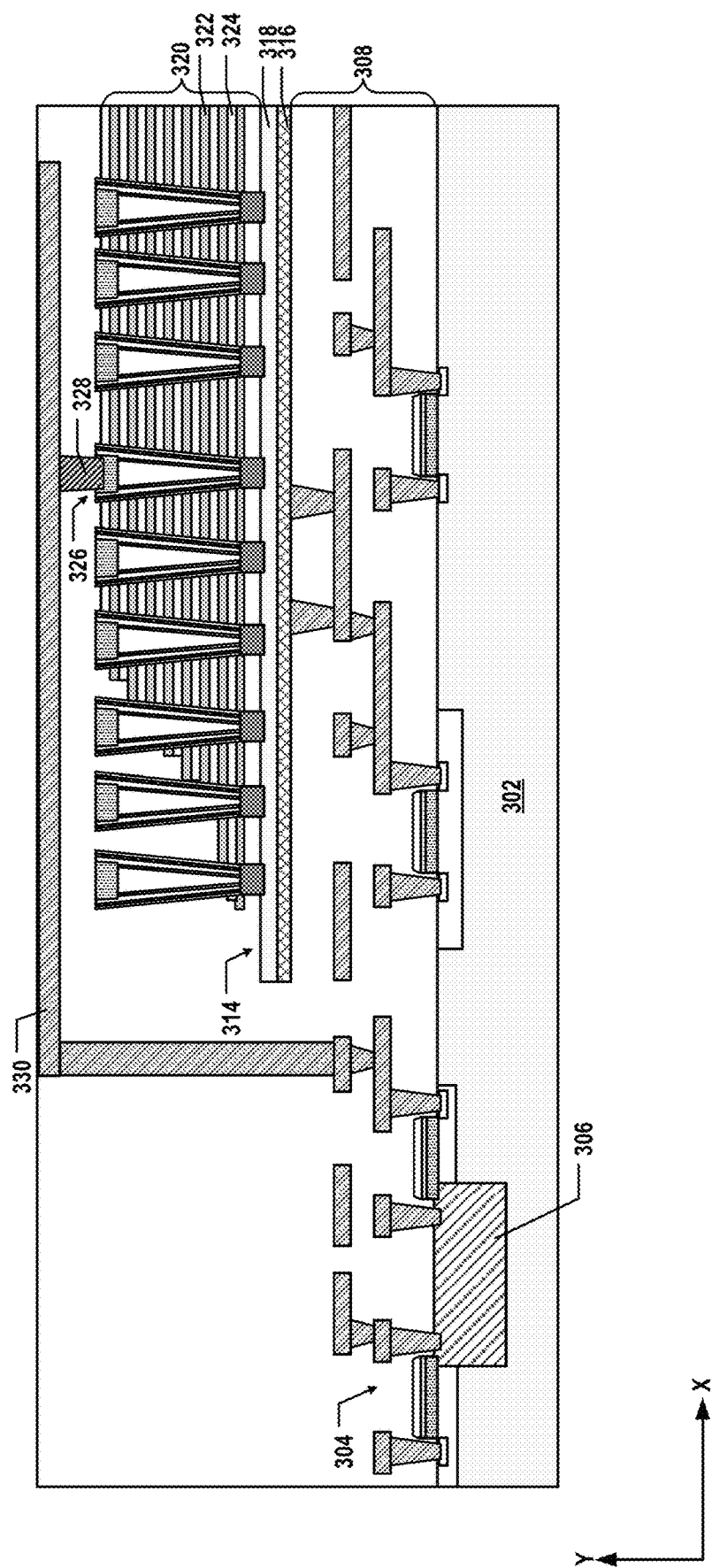

As illustrated in FIG. 3E, first NAND memory strings 326 are formed through memory stack 320 by depositing various layers into channel holes 327 (as shown in FIG. 3D). In some embodiments, fabrication processes to form first NAND memory string 326 include forming a plurality of lateral recesses to leave space for floating gates by wet etching and/dry etching of parts of silicon oxide layers 324 that abut channel holes 327. In some embodiments, fabrication processes to form first NAND memory string 326 further include forming a blocking layer, floating gates, a tunneling layer, a semiconductor channel, and a dielectric filling layer by subsequently depositing, for example, a silicon oxide layer, a polysilicon layer, a silicon oxide layer, a polysilicon layer, and a silicon oxide layer using one or more thin film deposition processes, such as PVD, CVD, ALD, or any combination thereof.

It is understood that in some embodiments in which memory stack 320 includes a plurality of conductor/dielectric layer pairs and first NAND memory string 326 is a "charge trap" type of NAND memory string, different fabrication processes are used. For example, a dielectric stack including interleaved sacrificial layers (e.g., silicon nitride layers) and dielectric layers (e.g., silicon oxide layers) can be first deposited on first source plate 314. "Charge trap" type of NAND memory string can be formed through the dielectric stack by first etching a channel hole extending vertically through the dielectric stack, followed by subsequently depositing a memory film (e.g., including a tunneling layer, a storage layer, and a blocking layer) and a semiconductor channel into the channel hole. A memory stack including interleaved conductor layers (e.g., tungsten layers) and dielectric layers (e.g., silicon oxide layers) then can be formed using the "gate replacement" processes, i.e., replacing the sacrificial layers in the dielectric stack with the conductor layers through slits extending vertically through the dielectric stack.

Method 400 proceeds to operation 410, as illustrated in FIG. 4, in which a first bit line is formed above and electrically connected to the first memory string and the peripheral device. As illustrated in FIG. 3E, first bit line contact 328 is formed through one or more ILD layers and in contact with the upper end of first NAND memory string 326, such that first bit line contact 328 is electrically connected to first NAND memory string 326. First bit line 330 then can be formed through the one or more ILD layers and in contact with both first bit line contact 328 and the interconnects in peripheral interconnect layer 308, such that first NAND memory string 326 is electrically connected to peripheral device 304, such as multiplexer 306.

In some embodiments, fabrication processes to form first bit line contact 328 and first bit line 330 include forming openings (e.g., via holes or trenches) using dry etching and/or wet etching, followed by filling the openings with conductive materials and other materials (e.g., a barrier layer, an adhesion layer, and/or a seed layer) for conductor filling, adhesion, and/or other purposes. First bit line contact 328 and first bit line 330 can include conductive materials including, but not limited to, W, Co, Cu, Al, doped silicon, silicides, or any combination thereof. The openings of first bit line contact 328 and first bit line 330 can be filled with conductive materials and other materials by ALD, CVD, PVD, electroplating, any other suitable processes, or any combination thereof.

Method 400 proceeds to operation 412, as illustrated in FIG. 4, in which a second source plate is formed above the first bit line and electrically connected to the peripheral interconnect layer. Method 400 proceeds to operation 414, as illustrated in FIG. 4, in which a second memory string extending vertically through a second memory stack is formed. The second memory string can be above and in contact with the second source plate. Method 400 proceeds to operation 416, as illustrated in FIG. 4, in which a second bit line is formed above and electrically connected to the second memory string and the peripheral device.

Figure 3F:
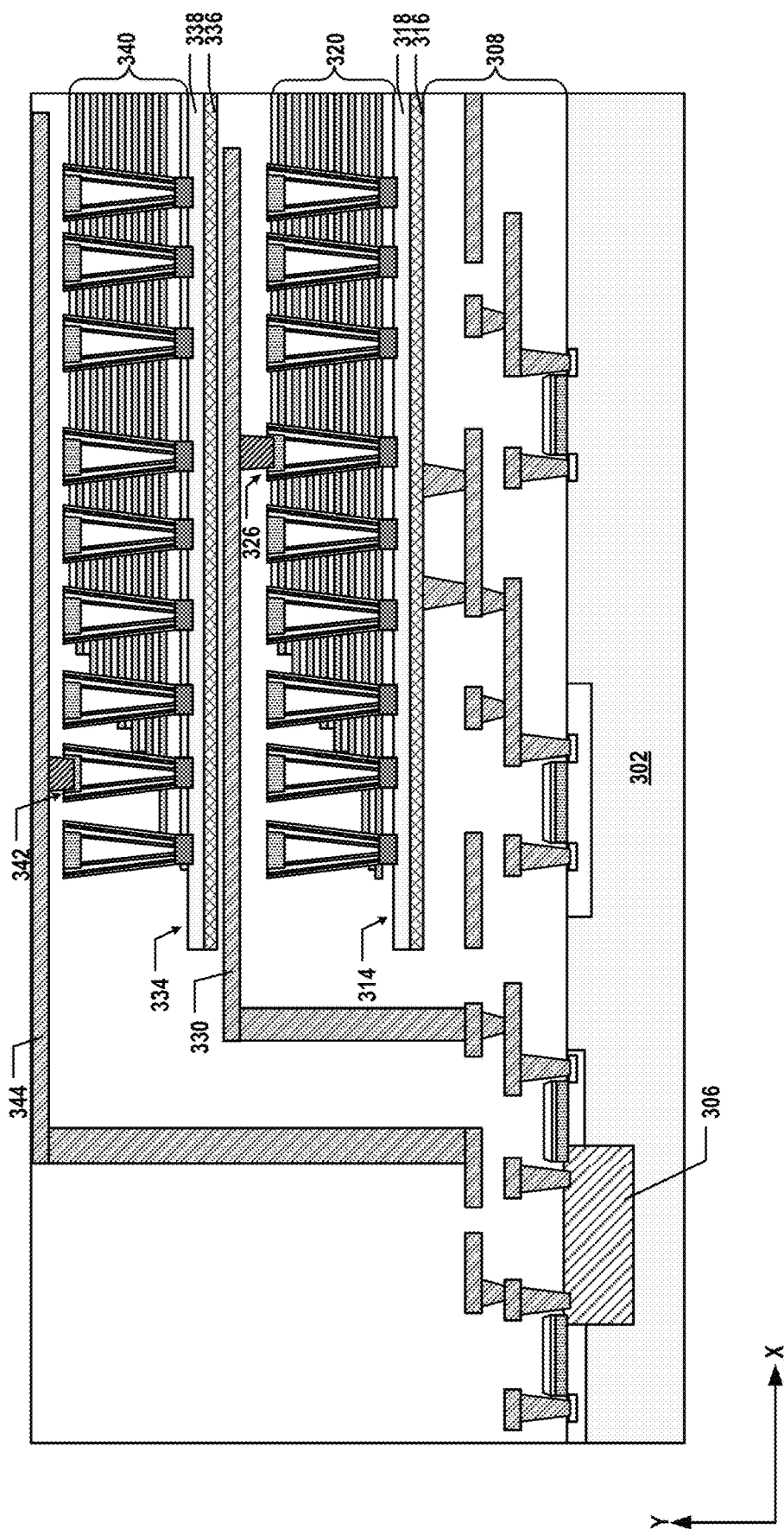

As illustrated in FIG. 3F, a second source plate 334 including a conductive plate 336 and a semiconductor plate 338 is formed above first bit line 330 and electrically connected to (not shown) peripheral interconnect layer 308. A second NAND memory string 342 extending vertically through a second memory stack 340 can be formed. Second NAND memory string 342 can be above and in contact with second source plate 334. A second bit line 344 can be formed above and electrically connected to second NAND memory string 342 and peripheral device 304, such as multiplexer 306. The fabrication details of second source plate 334, second memory stack 340, second NAND memory string 342, and second bit line 344 are similar to their counterparts in the first memory array device and thus, are not repeated. It is understood that similar fabrication processes can be used to form additional memory array device(s) stacked vertically above the second memory array device.

According to one aspect of the present disclosure, a 3D memory device includes a substrate, a peripheral device disposed on the substrate, a peripheral interconnect layer disposed above the peripheral device, a first source plate disposed above and electrically connected to the peripheral interconnect layer, a first memory stack disposed on the first source plate, a first memory string extending vertically through the first memory stack and in contact with the first source plate, and a first bit line disposed above and electrically connected to the first memory string and the peripheral device.

In some embodiments, the first source plate includes a conductive plate in contact with the peripheral interconnect layer, and a semiconductor plate disposed on the conductive plate and in contact with a lower end of the first memory string. The conductive plate can include metal silicide, and the semiconductor plate can include polysilicon.

In some embodiments, the 3D memory device further includes a second source plate disposed above the first bit line and electrically connected to the peripheral interconnect layer, a second memory stack disposed on the second source plate, a second memory string extending vertically through the second memory stack and in contact with the second source plate, and a second bit line disposed above and electrically connected to the second memory string and the peripheral device.

In some embodiments, the peripheral device includes a multiplexer configured to select one of the first and second memory strings. The peripheral device further includes a data buffer and a driver shared by the first and second memory strings through the multiplexer.

In some embodiments, the first memory stack includes interleaved polysilicon layers and silicon oxide layers. In some embodiments, the first memory string includes a plurality of floating gates.

According to another aspect of the present disclosure, a 3D memory device includes a substrate, a peripheral device including a multiplexer disposed on the substrate, a first memory stack disposed above the peripheral device, a first memory string extending vertically through the first memory stack, a first bit line disposed above and electrically connected to the first memory string and the multiplexer, a second memory stack disposed above the first bit line, a second memory string extending vertically through the second memory stack, a second bit line disposed above and electrically connected to the second memory string and the multiplexer. The multiplexer is configured to select one of the first and second memory strings.

In some embodiments, the peripheral device further includes a data buffer and a driver shared by the first and second memory strings through the multiplexer.

In some embodiments, the 3D memory device further includes a peripheral interconnect layer disposed above the peripheral device, a first source plate disposed between the peripheral interconnect layer and the first memory stack and that is electrically connected to the peripheral interconnect layer, and a second source plate disposed between the first bit line and the second memory stack and that is electrically connected to the peripheral interconnect layer.

In some embodiments, each of the first and second source plates includes a conductive plate in contact with the peripheral interconnect layer, and a semiconductor plate disposed on the conductive plate and in contact with a lower end of a respective first or second memory string. The conductive plate can include metal silicide, and the semiconductor plate can include polysilicon.

In some embodiments, each of the first and second memory stacks includes interleaved polysilicon layers and silicon oxide layers. In some embodiments, each of the first and second memory strings includes a plurality of floating gates.

According to still another aspect of the present disclosure, a method for forming a 3D memory device is disclosed. A peripheral device is formed on a substrate. A peripheral interconnect layer is formed above the peripheral device. A first source plate is formed above and electrically connected to the peripheral interconnect layer. A first memory string extending vertically through a first memory stack is formed. The first memory string is above and in contact with the first source plate. A first bit line is formed above and electrically connected to the first memory string and the peripheral device.

In some embodiments, to form the first source plate, a conductive plate is formed in contact with the peripheral interconnect layer, and a semiconductor plate is formed on the conductive plate and in contact with a lower end of the first memory string. The conductive plate can include metal silicide, and the semiconductor plate can include polysilicon.

In some embodiments, a second source plate is formed above the first bit line and electrically connected to the peripheral interconnect layer, a second memory string extending vertically through a second memory stack is formed, the second memory string being above and in contact with the second source plate, and a second bit line is formed above and electrically connected to the second memory string and the peripheral device.

In some embodiments, to form the peripheral device, a multiplexer configured to select one of the first and second memory strings is formed. In some embodiments, to form the peripheral device, a data buffer and a driver shared by the first and second memory strings through the multiplexer are formed.

In some embodiments, the first memory stack is formed by depositing interleaved polysilicon layers and silicon oxide layers. In some embodiments, to form the first memory string, a plurality of floating gates are formed.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a peripheral device comprising a multiplexer disposed on the substrate;
a first memory stack disposed above the peripheral device;
a first memory string extending vertically through the first memory stack;
a first bit line disposed above and electrically connected to the first memory string and the multiplexer, wherein the first bit line is electrically connected to a first drain at an upper end of the first memory string;
a second memory stack disposed above the first bit line;
a second memory string extending vertically through the second memory stack; and
a second bit line disposed above and electrically connected to the second memory string and the multiplexer, wherein the second bit line is electrically connected to a second drain at an upper end of the second memory string,
wherein the multiplexer is electrically connected to the first and second memory strings as inputs, and the multiplexer is configured to select one of the first and second memory strings to be forwarded through the multiplexer.

2. The 3D memory device of claim 1, wherein the peripheral device further comprises a data buffer and a driver electrically connected to an output of the multiplexer and shared by the first and second memory strings through the multiplexer.

3. The 3D memory device of claim 1, further comprising:
a peripheral interconnect layer disposed above the peripheral device;
a first source plate disposed between the peripheral interconnect layer and the first memory stack and that is electrically connected to the peripheral interconnect layer; and
a second source plate disposed between the first bit line and the second memory stack and that is electrically connected to the peripheral interconnect layer.

4. The 3D memory device of claim 3, wherein each of the first and second source plates comprises:
a conductive plate electrically connected to the peripheral interconnect layer; and
a semiconductor plate disposed on the conductive plate and in contact with a lower end of a respective first or second memory string.

5. The 3D memory device of claim 4, wherein the conductive plate comprises metal silicide, and the semiconductor plate comprises polysilicon.

6. A three-dimensional (3D) memory device, comprising:
a substrate;
a peripheral device disposed on the substrate;
a first memory stack disposed above the peripheral device;
a first memory string extending vertically through the first memory stack;
a first bit line disposed above and electrically connected to the first memory string and the peripheral device, wherein the first bit line is electrically connected to a first drain at an upper end of the first memory string;
a second memory stack disposed above the first bit line;
a second memory string extending vertically through the second memory stack;
a second bit line disposed above and electrically connected to the second memory string and the peripheral device, wherein the second bit line is electrically connected to a second drain at an upper end of the second memory string;
a third memory stack disposed above the second bit line;
a third memory string extending vertically through the third memory stack; and
a third bit line disposed above and electrically connected to the third memory string and the peripheral device, wherein the third bit line is electrically connected to a third drain at an upper end of the third memory string.

7. The 3D memory device of claim 6, wherein the peripheral device comprises a multiplexer electrically connected to the first, second, and third memory strings as inputs, and configured to select one of the first, second, and third memory strings to be forwarded through the multiplexer.

8. The 3D memory device of claim 7, wherein the peripheral device further comprises a data buffer and a driver electrically connected to an output of the multiplexer and shared by the first, second, and third memory strings through the multiplexer.

9. The 3D memory device of claim 6, further comprising:
a peripheral interconnect layer disposed above the peripheral device;
a first source plate disposed between the peripheral interconnect layer and the first memory stack and that is electrically connected to the peripheral interconnect layer; and
a second source plate disposed between the first bit line and the second memory stack and that is electrically connected to the peripheral interconnect layer.

10. The 3D memory device of claim 9, wherein each of the first and second source plates comprises:
a conductive plate electrically connected to the peripheral interconnect layer; and
a semiconductor plate disposed on the conductive plate and in contact with a lower end of a respective first or second memory string.

11. The 3D memory device of claim 10, wherein the conductive plate comprises metal silicide, and the semiconductor plate comprises polysilicon.

12. The 3D memory device of claim 9, further comprising:
a third source plate disposed between the second bit line and the third memory stack and that is electrically connected to the peripheral interconnect layer.

* * * * *